United States Patent [19]
Booske et al.

[11] Patent Number: 5,672,541
[45] Date of Patent: Sep. 30, 1997

[54] ULTRA-SHALLOW JUNCTION SEMICONDUCTOR DEVICE FABRICATION

[75] Inventors: John H. Booske; Steven S. Gearhart, both of Madison, Wis.

[73] Assignee: Wisconsin Alumni Research Foundation, Madison, Wis.

[21] Appl. No.: 490,242

[22] Filed: Jun. 14, 1995

[51] Int. Cl.⁶ .................................................. H01L 21/225
[52] U.S. Cl. .......................... 437/160; 437/57; 437/168; 437/950
[58] Field of Search ........................... 437/160, 165, 437/166, 168, 169, 950, 57; 148/DIG. 144

[56] References Cited

U.S. PATENT DOCUMENTS

| | | | |
|---|---|---|---|
| 4,033,790 | 7/1977 | Gunjigake et al. | 437/168 |
| 4,526,826 | 7/1985 | Ten Eyck et al. | 437/168 |
| 4,587,430 | 5/1986 | Adler | 250/492.2 |
| 4,588,455 | 5/1986 | Genser | 437/168 |
| 4,764,394 | 8/1988 | Conrad | 427/525 |
| 4,937,205 | 6/1990 | Nakayama et al. | 437/165 |
| 5,013,578 | 5/1991 | Brown et al. | 427/455 |
| 5,126,163 | 6/1992 | Chan | 427/531 |
| 5,212,425 | 5/1993 | Goebel et al. | 250/492.21 |
| 5,218,179 | 6/1993 | Matossian et al. | 219/121.43 |
| 5,270,250 | 12/1993 | Murai et al. | 437/950 |
| 5,296,272 | 3/1994 | Matossian et al. | 427/523 |
| 5,330,800 | 7/1994 | Schumacher et al. | 427/523 |
| 5,354,381 | 10/1994 | Sheng | 250/492.2 |
| 5,374,456 | 12/1994 | Matossian et al. | 427/523 |
| 5,389,195 | 2/1995 | Ouderkirk et al. | 427/525 |

FOREIGN PATENT DOCUMENTS 9318201 9/1993 WIPO.

OTHER PUBLICATIONS

J.R. Conrad, et al., "Plasma source ion–implantation technique for surface modification of materials", J. Appl. Phys. vol. 62, No. 11, Dec. 1987, pp. 4591–4596.

J.R. Conrad, et al., "Manufacturing Aspects of Plasma Source Ion Implantation", PED, vol. 41, 1989, pp. 65–70.

Shamim M. Malik, et al, "Overview of plasma source ion implantation research at University of Wisonsin–Madison", J. Vac. Sci. Technol. B, vol. 12, No. 2, Mar./Apr. 1994, pp. 843–849.

Tohru Hara, et al., "Formation of Shallow p+ Layer in Silicon by Plasma Doping,"App. Phys. Lett., vol. 63, No. 1, 5 Jul. 1993, pp. 90–92.

(List continued on next page.)

*Primary Examiner*—Chandra Shaudhari
*Attorney, Agent, or Firm*—Foley & Lardner

[57] ABSTRACT

A practical, low-cost and low hazard method and apparatus for the fabrication of ultra large scale integrated circuits is provided. Plasma source ion implantation (PSII) is employed for realizing required ultra-shallow doping junctions, while avoiding previous difficulties and costs associated with PSII of dopant containing plasmas generated from hazardous gases. The invention makes use of solid boron sources, such as boron carbide ($B_4C$), for p-type doping, and solid phosphorus sources, such as red phosphorus, for n-type doping. The solid dopant sources are both stable and relatively inexpensive. Thin layers of p-type or n-type material are deposited on the surface of a semiconductor substrate, such as of Si, by sputtering or vaporization of the solid dopant source material. PSII using a plasma generated from a non-reactive gas, such as argon, is then used to drive the deposited dopant atoms into the surface of the substrate. Deposition and implantation steps may be followed by sputter cleaning of the substrate, such as by use of an argon plasma, to remove any remaining film of dopant material from the substrate. A subsequent annealing step is used to heal the crystalline lattice of the substrate, and to diffuse any incidentally implanted argon ions from the substrate. To prevent deposition of impurities into the substrate as a result of argon sputtering of the PSII chamber walls, the walls may be coated with a thin film of $B_4C$ prior to PSII processing.

17 Claims, 3 Drawing Sheets

OTHER PUBLICATIONS

Tohru Hara, et al., "Damage Formed by Plasma Boron Doping in Silicon," Japan. J. Appl. Phys., vol. 33, pt. 1, No. 10, Oct. 1994, pp. 5608–5611.

D.L. Chapek, et al., "Structural Characterization of Plasma–Doped Silicon by High Resolution X–Ray Diffraction," J. Vac. Sci. Technol. B, vol. 12, No. 2, Mar./Apr. 1994, pp. 951–955.

ULTRA-SHALLOW JUNCTION SEMICONDUCTOR DEVICE FABRICATION

FIELD OF THE INVENTION

This invention pertains generally to methods and devices for manufacturing ultra large scale integrated (ULSI) semiconductor devices, and more particularly to methods and devices employing plasma source ion implantation (PSII) for the manufacturing of such ULSI semiconductor devices.

BACKGROUND OF THE INVENTION

Semiconductor materials, such as silicon, form the basis of most modern electronic devices. Semiconductor materials have a crystalline structure in which each atom is tightly bound to its neighbor. As a result, pure semiconductor materials are very poor conductors of electricity, because few of the electricity carriers are mobile. Even though some electrons in a pure semiconductor material can acquire sufficient energy to break free of the lattice structure and become conductors, the intrinsic conductivity of pure semiconductors is insufficient to make them useful as electronic devices. However, the addition of even extremely small amounts of certain types of impurities into the semiconductor's crystalline lattice can provide a tremendous increase in the number of current carriers. Usually the impurity selected is an atom of the same size as the semiconductor atom but having a different number of electrons in its outer valence band. This results in a chemically bonded structure wherein an unbonded electron or hole is able to move around in the structure with very little energy expenditure. The process of adding an impurity to a pure semiconductor is known as "doping".

The pattern and concentration of doped regions on the surface of a semiconductor wafer determine the number and complexity of electronic devices which may be included on a single integrated circuit chip. Current manufacturing trends indicate that by the end of the decade ultra large scale integrated (ULSI) semiconductor devices, such as 250 Mbyte dynamic memory units (DRAMs) and 250 MHz microprocessors integrating more than 100 million transistors, will be commercially manufactured. At such integration levels the dimensions of semiconductor device and interconnection features must be reduced below 0.25 microns. This translates into a requirement for silicon based complementary metal-oxide-semiconductor (CMOS) devices having effective channel lengths of less than 0.2 microns and shallow-doped junctions with junction depths of less than 300 angstroms. The requirement for ultra-shallow-doped semiconductor junctions strains the capabilities of current processing techniques for doping semiconductor wafers.

An early developed method for the doping of semiconductor devices was via thermal diffusion. Doping is accomplished under this method by placing a semiconductor wafer in a high temperature diffusion furnace which is filled with a dopant containing a gas. Under high temperature conditions the dopant diffuses from the gas into the semiconductor surface. This process worked well for the creation of most early semiconductor devices, such as discrete transistors. A low-energy thermal diffusion method of implantation into preamorphised silicon surfaces is currently used to form shallow-doped junctions with junction depths on the order of 1,000 angstroms. However, as it becomes important to increase the number and decrease the size of each device on a given piece of silicon, it becomes increasingly important to gain more precise control over the spatial distribution and concentration of impurities added to the semiconductor than is possible employing the diffusion process. Thermal diffusion methods presently employed will not be able to deliver the required dopant concentrations in sufficiently shallow layers for the next generation in ULSI technology. The low thermal budget requirements of very large scale integrated circuit technologies impose important constraints on junction formation and the subsequent contact and interconnect processing temperatures. The thermal diffusion method of semiconductor processing is, therefore, not suitable for the fabrication of next generation ULSI devices because preamorphisation and thermal budget constraints lead to incomplete damage annealing of the silicon lattice after diffusion of the doping material, and to dopant activation which causes excessive junction leakage, high contact resistance, and degraded breakdown characteristics.

As the scale of semiconductor device integration has increased, the thermal diffusion method of semiconductor processing has been replaced in many instances by the use of ion beam implantation systems. Ion beam implantation devices are large complex devices capable of very precise position control of a dopant ion beam. Doping is achieved by scanning the ion beam over a semiconductor wafer surface. The standard ion beam implantation system has certain limitations for those applications, such as shallow junction doping, where a low energy beam, under 10 kV, is required. The limitations of ion beam systems are particularly acute where there is a requirement for both high dose dopant implantation and high production rate. The production rate or wafer throughput of an ion beam type processing apparatus, requiring the individual scanning of each wafer surface, is limited.

A recently proposed alternative approach to the fabrication of shallow-doped junctions is selective silicon epitaxy. However, the applicability of this method to the manufacturing environment is highly speculative. Preliminary data indicates that the use of this method can result in severe lateral encroachments and enormous non-uniformities in the doped junctions across large semiconductor wafer surface areas.

Another process for the fabrication of shallow-doped junctions which has been suggested is gas immersion laser doping. This process provides excellent selectivity of doped regions. However, it is unlikely to find success in the manufacturing arena due to its low potential throughput rate, complex processing requirements, and the local heating of the semiconductor wafer substrate which results from the process.

A general method and apparatus for implanting ions into target surfaces was disclosed in U.S. Pat. No. 4,764,394, to John R. Conrad, entitled "Method and Apparatus for Plasma Source Ion Implantation". The plasma source ion implantation (PSII) method involves placing a target to be implanted within a vacuum chamber, generating a high ion density plasma in the chamber surrounding the target object, and negatively biasing the target object to cause positive ions from the plasma to be accelerated toward the target object surface at an ion energy sufficient for the ions to become implanted therein. PSII techniques have been used in the past predominantly for non-semiconductor processing related applications. For example, PSII methods have been found effective for the coating and hardening of metal surfaces. More recently, investigations have been conducted into the use of PSII for shallow-doped semiconductor fabrication. Using PSII, large surface areas can be implanted quickly without any scanning.

For Si based semiconductor manufacture, the preferred dopant materials are arsenic (As) and phosphorus (P) for n-type doping, and boron (B) for p-type doping. These dopant materials are preferred because they have desirable diffusivity characteristics, energy band structure properties, and solubilities in silicon (Si). The standard PSII process for shallow-doped semiconductor fabrication makes use of a plasma of dopant ions. The plasma is generated from dopant species which are introduced into the PSII processing chamber in gaseous form. For p-type doping, with B as the dopant material, the dopant containing plasma is typically generated from $BF_3$ (boron trifluoride) or $B_2H_6$ (diborane) gases. For n-type doping, with P or As as the dopant material, the dopant containing plasma is typically generated from a P containing gas, such as "phosphine", or an As containing gas such as "arsine".

Standard PSII techniques for the implantation of impurities into a semiconductor are characterized by several significant difficulties. In the first instance, all practical gaseous sources of B, P, or As, such as those described above, are extremely hazardous. These gases, from which the plasma of dopant material is generated, are highly toxic, reactive with the metals and seals of the PSII processing chamber, and often flammable. Special gas handling and vacuum pumping technologies must be employed and constantly maintained to safely handle these gases. Moreover, the use of a plasma source for dopant ions, rather than a more conventional line-of-sight ion beam, introduces additional challenges into the design and maintenance of the PSII vacuum chamber system. The plasma, which is the source of the dopant ions, also interacts with the PSII vacuum chamber walls, which are typically made of stainless steel or aluminum. This interaction can result in the sputtering of material from the chamber walls by the source plasma, thereby introducing trace concentrations of iron, aluminum, or other metallic impurity ions into the plasma. Eventually, these metallic impurity ions become implanted into the Si wafer substrate with deleterious results. Thus, the vacuum chamber and pumping system must be designed and maintained to minimize contamination of the substrate by these transition-metal ion impurities to satisfy the requirement for a very high purity semiconductor device. Further, the use of fluorine (F) or chlorine (Cl) containing gaseous compounds (e.g., $BF_3$ or $BCl_3$) for PSII doping of semiconductors can result in unwanted etching of previously fabricated device features because of the presence of highly reacting F or Cl containing ions or radicals.

One way to reduce sputtering of contaminants from the chamber walls has been to line the PSII processing chamber with a material which does not contain elements which should not be co-implanted. It has been suggested that liners could be made of materials which are resistant to sputtering or chemical etching by the plasma species. For traditional PSII processing of semiconductor devices employing a $BF_3$ plasma, suggested resistant materials include oxides, i.e., alumina, nitrides, i.e., boron nitride or silicon nitride, or carbides, i.e., silicon carbide. Alternatively, it has been suggested that the liner could be of a sacrificial material which has measurable etch rates in the presence of the plasma species, but does not contribute undesirable impurities which could be co-implanted. Suggested sacrificial materials include carbon, i.e., graphite or diamond, or polycrystalline silicon. It has been suggested that PSII chambers could be coated with films of liner materials which are applied by plasma spraying, CVD, sputtering, or evaporation. It has also been suggested that PSII chambers could be protected by separate pieces of material composed entirely of or coated with the desired liner material.

Vacuum system construction and maintenance requirements, unwanted etching and hazardous gas handling system requirements, present major obstacles to the application of existing plasma-based fabrication methods to ULSI manufacture. Both challenges, of hazardous gas handling and of the minimization of metallic impurity ion contamination, can be made manageable in commercial fabrication facilities. However, the additional costs in proper equipment, special pumping fluids, and meticulous vacuum system practices and maintenance schedules can be significant. The mitigation of unwanted etching (during dopant implantation) may require that the use of compounds containing F or Cl be avoided.

SUMMARY OF THE INVENTION

In accordance with the present invention, a practical, low-cost, low hazard, and essentially etch-free method and apparatus for the fabrication of ultra large scale integrated (ULSI) circuits is provided. The present invention employs relatively low voltage plasma source ion implantation (PSII) technologies for the doping of ultra-shallow device junctions in semi-conductor devices. The present invention realizes shallow junctions in Si-based ULSI complementary metal-oxide-semiconductor (CMOS) integrated device structures, while avoiding the difficulties and costs associated with the hazardous gas handling and the impurity ion contamination from plasma sputtering of metallic vacuum vessel walls which are characteristic of prior art PSII techniques for semiconductor device manufacture.

The present invention employs a solid boron or solid boron compound sputter target as a source of p-type dopants, solid red phosphorus as a source of n-type dopants, and a non-reactive gas plasma for PSII implantation of the dopant materials into a semiconductor substrate. Pure boron may be used as the sputter target. A suitable solid boron compound is boron carbide ($B_4C$), a stable and relatively inexpensive ceramic. Red phosphorus is a relatively stable and inexpensive form of solid pure P. The use of B and P in solid form is a major advantage of the present invention, eliminating the hazards or undesirable etching associated with the gaseous forms of these dopant materials. The fraction of original dopant atoms which are implanted in the substrate (the dopant material utilization fraction) will typically be higher in the present invention than with gas based PSII semiconductor doping.

In accordance with the present invention, a CMOS integrated device structure may be produced on a Si substrate. The Si substrate, such as an n-type Si wafer commonly available on the raw materials market, is inserted into a vacuum chamber for processing. The target wafer may be masked in a common manner, so that desired doping patterns may be defined on the substrate surface. A thin film of the solid boron or boron compound material is then deposited onto the substrate in locations where p-type doping is required. This may be accomplished by sputtering material from a solid B compound deposition source. PSII, using a plasma generated from a non-reactive gas such as argon, is then used to drive the doping material into the substrate surface. The bombarding ions from the PSII plasma knock a certain fraction of the B atoms (and C atoms for $B_4C$) from the thin film into the substrate to form a very shallow doped surface layer. This may be followed by a sputter cleaning, such as with an argon plasma, of the implanted substrate surface to remove any excess film of doping material. An annealing step, which heals the substrate's crystal lattice, activates the dopant, and causes any implanted argon ions to diffuse out of the substrate, completes the process.

In a similar manner, n-type regions may be implanted into the substrate using the solid P material as a dopant source.

Conventional masking techniques are used to define the areas where n-type doping is to be applied to the substrate surface. A thin film of P is deposited on the areas to be implanted with n-type material. This may be accomplished by vapor deposition, such as by heating the solid red P dopant source in a hearth, and allowing the evaporated P to stream out onto the target substrate surface. PSII using an inert gas plasma, such as a plasma generated from argon gas, is then used to implant the n-type dopant by knocking the required concentration of P atoms into the substrate. If necessary, a sputter cleaning of the substrate, such as with an argon gas plasma, is used to remove any remaining P film from the substrate surface. An annealing step, as described above, is also employed.

In order to eliminate contamination of the substrate surface by a sputtering of material from the processing chamber walls, the chamber walls may be coated with a thin film or liner of boron or a boron compound such as $B_4C$. During subsequent PSII treatment of the substrate, any plasma sputtering of exposed chamber surfaces will only generate trace levels of B (and possibly carbon) in the substrate. Thus, only intended species, rather than impurity species, will be deposited. Coating of the processing chamber walls to eliminate sputter contamination allows for a reduction of the severity with which the vacuum conditions of the processing chamber must be maintained for shallow junction CMOS fabrication.

The present invention advantageously employs boron or solid boron compounds, such as $B_4C$, and solid red-type phosphorus which are relatively commercially abundant and available at low cost. Also, the relatively benign nature of these solid dopant material sources reduces the need for the sophisticated and expensive equipment required to manage gaseous sources of B or P dopants. Moreover, the ease of obtaining a thin film liner of B or $B_4C$ to coat the walls of the PSII processing chamber is advantageously employed to prevent contamination of the target wafer due to sputtering of material from the chamber walls during PSII processing. The combined advantages of the present invention for the production of ultra shallow junction integrated semiconductor devices will provide significant reduction in both the expensive and exacting vacuum system construction and maintenance requirements, as well as the hazardous gas handling system requirements, of other plasma based semiconductor device fabrication processes.

Further objects, features and advantages of the invention will be apparent from the following detailed description when taken in conjunction with the accompanying drawings.

DETAILED DESCRIPTION OF THE INVENTION

Figure 1:
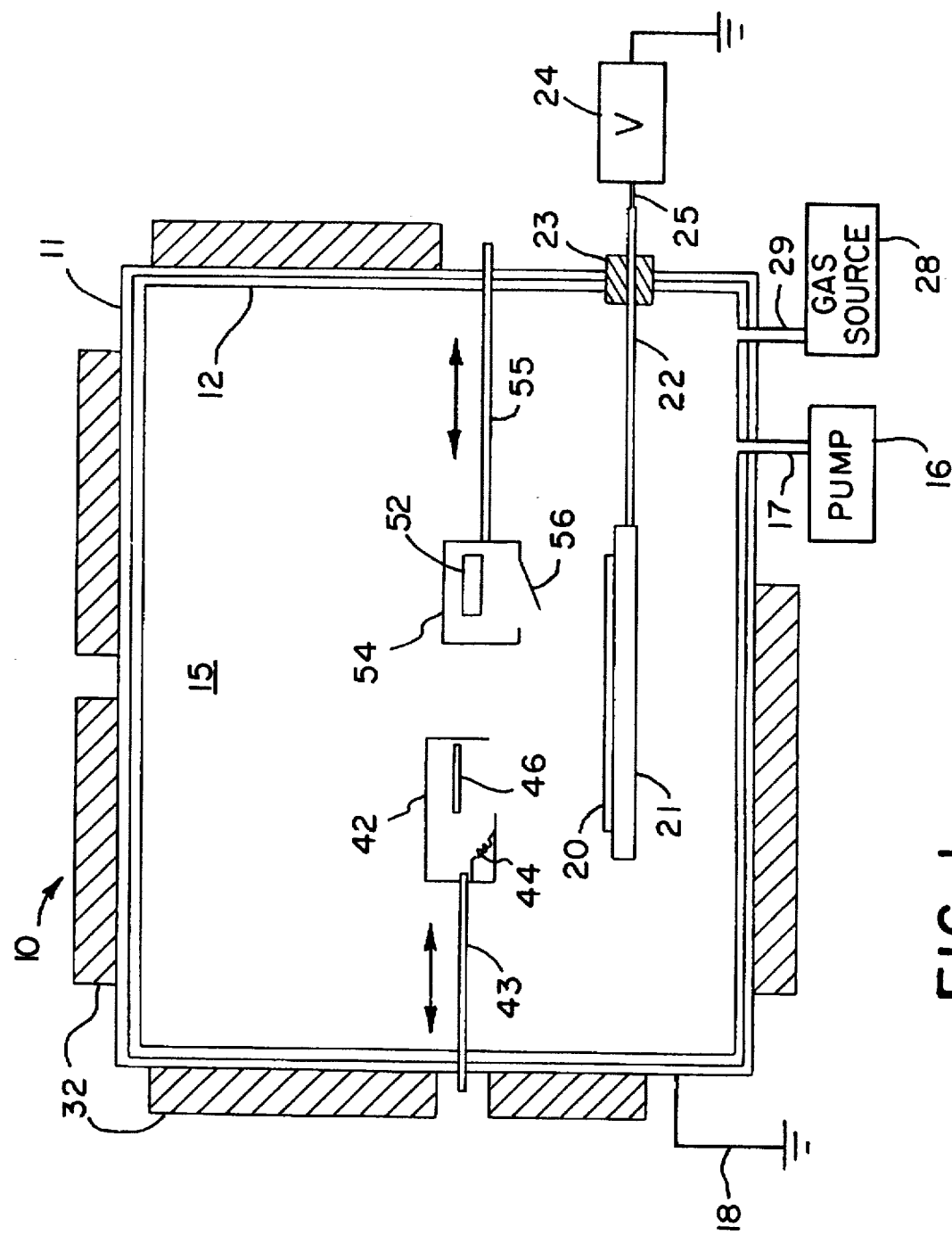
FIG. 1 is a simplified cross-sectional view through an ion implantation chamber with associated apparatus for the doping of shallow junction integrated semiconductor device structures in accordance with the present invention.

An apparatus for the fabrication of ultra-shallow junction semiconductor devices in accordance with the present invention is shown generally at 10 in the simplified cross-sectional view of FIG. 1. The apparatus 10 includes an enclosing chamber 11 having conductive walls, e.g., of stainless steel or aluminum. A vacuum pump 16 is connected by an exhaust line 17 to the interior 15 of the chamber 11 and operates to evacuate the chamber to a very low based pressure vacuum level, typically on the order of $10^{-5}$ to $10^{-6}$ Torr. The operating pressure within the chamber 11 will typically be on the order of $10^{-4}$ Torr. All of the walls making up the chamber 11 are electrically connected together and connected by a line 18 to ground.

A target object substrate 20, such as a Si wafer, is mounted in the interior 15 of the chamber 11, spaced away from all of the walls of the chamber 11, on a conductive stage 21 at the end of a conductive support arm 22. The target substrate 20 may be placed on and removed from the stage 21 through a door (not shown), formed in a conventional fashion in a wall of the chamber 11 which, when closed, seals airtight to the chamber wall and is also electrically connected to the wall to be at the same potential as the wall. In addition, the orientation may be such that the target substrate 20 may be placed on the underside of the stage 21. The arm 22 holds the target substrate 20 in a fixed position. The target substrate 20 may be attached to the conductive stage 21 such as by a clamp (not shown). The arm 22 may be covered with electrical insulation, if desired, or even shielded so that ions are not attracted to the arm 22. In addition, the support arm 22 may also be formed so that a coolant fluid is circulated through it to allow thermodynamic cooling of the target substrate 20 during processing to maintain the target in substantial thermal equilibrium. Low temperature operation is desirable, since the final implantation junction depth of dopant ions is, in part, a function of the processing temperature. Additionally, temperatures must be kept relatively low in order to avoid degradation of photoresist layers or masks which may be present on the surface of the target substrate 20. The conductive support arm 22 is electrically isolated, by an insulator 23, from the conductive wall of the chamber 11 through which it passes. The insulator 23 is also formed to provide an air-tight seal to the wall of the chamber 11.

A high voltage, pulse power supply 24 is used to provide voltage pulses through a supply line 25 to the conductive support arm 22. The power supply 24 is preferably capable of providing repetitive pulses of voltage, e.g., in the 1 kV to several kV range, and of a duration as described in more detail below. For example, the voltage supply 24 may be of the pulse line-pulse transformer type providing pulse lengths in the range of a few microseconds, or the supply may be chosen from various types of high voltage tube modulated pulsers capable of providing relatively long pulse lengths of up to the millisecond range or longer. For certain applications, the high voltage may also be applied continuously, such as from a DC power supply.

In accordance with this invention, an ionized plasma is provided which surrounds the target wafer surface 20 so that ions may be accelerated from the plasma to impact the target surface. To develop the surrounding plasma in the processing chamber 11 from an ambient gas, a gas source 28 is connected by a line 29 to leak the gas at a low, controlled rate into the chamber 11 as the chamber 11 is being evacuated by the vacuum pump 16. There may thus be provided, prior to ionization, a low pressure atmosphere of gas from the gas source 28 within the chamber 11 mixed with very low levels of other impurity gases, such as oxygen, etc. The neutral gas within the chamber may be ionized in various ways, as described in more detail below.

To prevent impurity species from sputtering off of the chamber walls 11 and being deposited into the substrate 20, the walls of the process chamber 11 may be coated with a thin film liner 12. It is preferable that the thin film coating 12 be made of the same material which is to be intentionally deposited in the doping of the substrate 20. Thus, for purposes of the present invention, a thin film liner of boron is preferred. This may be readily applied by sputter vapor deposition. An alternative liner material is boron carbide ($B_4C$), which may also be applied by sputter deposition. Alternatively, a coating of $B_4C$ on the processing chamber wall 11 may be achieved by a plasma discharge employing both argon and tri-methyl boron. This leaves a film of C—H—B compound on the stainless steel walls of the chamber 11. A subsequent plasma discharge treatment with pure argon plasma removes the H, leaving a $B_4C$ film coating on all exposed surfaces of the chamber 11. This coating may also include the conducting stage 21 and connecting arm 22 as well as any electron source filaments or rf capacitor plates used in the generation of the plasma for the PSII step of the present invention. With all exposed surfaces coated in the manner described, any plasma sputtering of the exposed chamber surfaces during PSII treatment of the substrate 20 will only generate trace levels of B (and possibly C), which, as described below, are intended, rather than impurity species, for this process. Coating of the exposed process chamber surfaces in this manner permits a reduction in the severity with which one must maintain the vacuum conditions in the chamber 11 for shallow junction CMOS fabrication.

Magnets 32, in the form of magnetic bars or magnetic pellets, are preferably but not necessarily distributed around the walls of the chamber 11. Adjacent magnets 32 are oppositely poled—i.e., alternating north to south to north, etc.—so that magnetic lines of force run between adjacent magnets 32 within the interior 15 of the chamber 11. The magnetic field thus formed around the interior 15 of the chamber adjacent to the walls of the chamber 11 causes electrons from a plasma generated within the chamber 11 to turn around as they approach the wall and move back into the interior 15 of the chamber, where they may collide with gas atoms or molecules to enhance and maintain the ionization process.

More details on the construction and operation of PSII devices may be found in U.S. Pat. No. 4,764,394, the disclosure of which is incorporated herein by reference.

The method of employing the apparatus 10 for the practical, etch free, low-cost, and low hazard manufacture of ultra shallow junction semiconductor devices is now described in more detail with reference to FIGS. 2–6. The process and associated apparatus will be described in detail with respect to the exemplary manufacture of an ultra-shallow junction Si-based CMOS device. It will be apparent from the following detailed description that other semiconductor device structures (for example, flat panel displays) may also be made in accordance with the method and device of the present invention.

To provide doping of a semiconductor substrate, such as Si, the present invention employs a solid B source for p-type doping, a solid P source for n-type doping, and a plasma generated from a non-reactive gas for driving the doping material into the substrate 20. Pure boron or a boron compound may be used. A preferable boron compound for p-type doping is $B_4C$, boron carbide. $B_4C$ is a stable and relatively inexpensive ceramic which is available in single crystal, high purity form. Other solid boron compounds may also be used. For example, BN (boron nitride) is a possible alternative to $B_4C$, however, the N component of this compound would not provide as good a fit with Si as the C component of $B_4C$. Solid boron in a pure form may also be used rather than a solid boron compound. A preferable solid source of n-type dopant is red phosphorus. Red phosphorus is a relatively stable and inexpensive form of solid pure P. The use of p-type and n-type dopant sources in solid form, rather than in hazardous gas form, is a major advantage of the process of the present invention over prior art semiconductor device fabrication processes employing PSII for dopant implantation.

As will be described in more detail below, a plasma generated from a non-reactive gas is used to drive the dopant materials into the substrate 20. Non-reactive gases must be used to generate the plasma because reactive gases would either etch the substrate 20 or form undesirable compounds in the Si substrate 20. A plasma generated from argon gas is preferred. The argon ions in such a plasma are the appropriate size for driving the dopants into the substrate 20. Other noble gases, such as helium or krypton, could also be used to form the non-reactive gas plasma.

The process for fabricating an ultra-shallow junction semiconductor device in accordance with the present invention begins with placing the substrate wafer 20 into the vacuum chamber 11 on the wafer stage 21. Although a single processing chamber 11 is shown, multiple processing chambers could be used. For example, each of the steps described below could be performed in separate processing chambers. For the fabrication of a CMOS structure in accordance with the present invention, the substrate wafer 20 is preferably an n-type Si substrate, e.g., a Si wafer from a single crystal melt. N-type wafers of this sort are commonly available on the raw materials market. Any commonly available n-type wafer may be used. However, the initial doping of the n-type wafer may affect the results of the process of the present invention. Similarly, the orientation of the Si wafer 20 with respect to the dopant sources, may also affect the results of the process. Therefore, it is preferable that calibration runs be made to determine the wafer characteristics and orientation which provide the final product characteristics desired.

Figure 2:
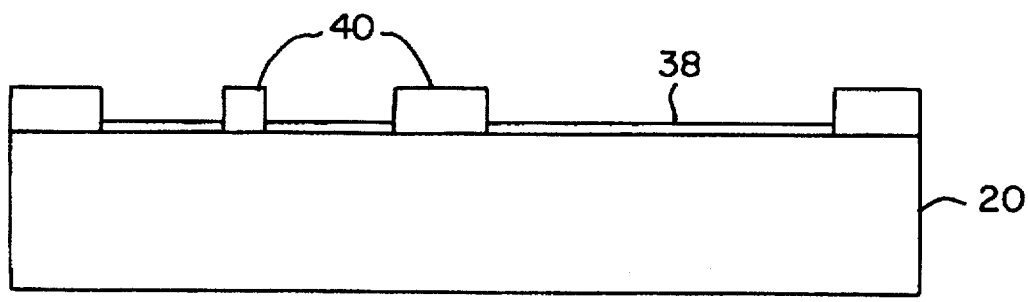
FIG. 2 is a simplified illustrative side view of an n-type Si substrate with a mask material and thin film of p-type material deposited thereon.

The first step in the fabrication of a CMOS device is the implantation of p-type regions into the Si substrate. This includes the p-type regions 34 on the left side of the completed CMOS device shown in FIG. 6, as well as the p-doped well 36 on the right side of the CMOS device. As shown in FIG. 2, a thin film of the solid dopant material 38, e.g., B or $B_4C$, is deposited onto the Si substrate in spots where p-type doping is required. The depth of the deposited material may be approximately 5 to 20 angstroms. A masking material 40 is preferably used to prevent deposition on areas of the substrate 20 where no doping is to take place. Masking materials and techniques common to semiconductor processing may be used. These well known techniques variously employ masking, etching, and lithography, etc. to achieve dopants in the correct locations and patterns on the substrate 20.

The boron material is deposited on the substrate 20 using a deposition source 42 located in the processing chamber 11.

The p-type deposition source 42 may be attached to a support arm 43 and may be admitted to or removed from the chamber 11 through a door (not shown) in the chamber wall. The arm 43 and the door may be formed in a conventional fashion such that the integrity of the vacuum chamber is maintained and such that the door is electrically connected to the chamber wall to be at the same potential as the wall. Alternatively, deposition of the p-type material may take place in a separate vacuum chamber, with a fixed p-type deposition source 42 under which the substrate wafer 20 is placed. A preferable p-type deposition source 42 is a sputter deposition source. This type of deposition source is particularly useful for materials, such as B or $B_4C$, having high melting or sublimation temperatures. The sputter deposition source 42 includes an electron source 44, such as a filament, for directing electrons at a target 46 made of the solid doping material, e.g., B or $B_4C$. Electrons directed from the electron source 44 against the B or ceramic $B_4C$ target material 46 vaporize the material. The material thereby sputtered from the target exits the deposition source 42 and is deposited as a thin layer 38 on the substrate 20. Alternatively, the p-type deposition source 42 could conceivably be a hearth which uses a laser for heating of the target to sublimate boron containing material from the target 46. However, such a hearth would use more energy than the sputter deposition source 42 described.

For p-type doping, ideally one might prefer a pure B source rather than $B_4C$. This is because the subsequent implantation step will drive both B and C atoms into the Si substrate 20. However, the benign nature, inexpensive cost, easy availability, and excellent chemical stability of $B_4C$ make it extremely attractive to accept simultaneous implantation of C along with the B, given that the presence of carbon will in many cases not degrade the final product. The simultaneous implantation of C and B will have largely the equivalent effect of pure implantation of B. Although C acts as a donor and B as an accepter site in Si, the band gap for C in Si (approximately 0.25 eV below the conduction band) is much greater than the band gap for B in Si (approximately 0.045 eV above the valance band). At near room temperatures, and for equal concentrations of B and C in Si, the equilibrium level of conduction electrons associated with C sites can be expected to be much less than the available number of holes generated by the B sites. Hence, the presence of the carbon-donated conduction electrons will not significantly reduce the boron-donated hole-carrier lifetime due to recombination. Moreover, if the source of B and C is $B_4C$, then one can expect the relative concentration of B sites to be at least four times as great as C sites (perhaps more, depending upon the solubility limits, desired dopant concentrations, and kinetics of the process steps). This further implies that the presence of C will not significantly degrade the action of the primary B dopant for many applications.

The doping of the Si substrate with $B_4C$ causes SiC to be formed. The voltage needed to switch SiC from an insulator to a conductor is lower than in Si by itself, but is much higher than switching in B-doped Si. Thus, SiC is a semiconductor having a higher band gap, which means a higher switching voltage, than B doped Si. SiC is an intrinsic semiconductor material of recent interest for high power semiconductor applications. Hence, C in Si is not regarded in general as an incompatible chemistry.

Finally, Si and carbon have approximately the same atomic radius. For example, both carbon and Si have very similar ionic radii in crystalline structures (2.6 angstroms for C and 2.7 angstroms for Si). There will thus not be significant swelling of the Si lattice resulting from the implantation of carbon therein. Therefore, the implanted carbon is not likely to be the source of added crystalline stress, and thus a source for defects. Although the diffusivity of C in Si is higher than B or P, the difference is only approximately one order of magnitude, and therefore still feasible for shallow-doped junction applications.

Another result of doping using a $B_4C$ dopant source is that all B-implanted regions will be indicated by a significant simultaneous concentration of C ions, possibly as high as one C ion for each four B ions. Reaction kinetics, different solubility limits, and a slightly higher diffusivity of C over B in Si may lead t0 B/C ratios slightly higher than 4:1 after all processing is completed. Such a B/C ratio provides a signature which is unique to a semiconductor device fabrication process based on the use of $B_4C$ as a source of B dopant.

After the thin layer of p-type dopant 38 is deposited on the substrate surface 20, the deposition source 42 is removed from the processing chamber 11, or the wafer stage 21 may be moved away from the source 42, or the wafer 20 may even be moved to a separate chamber for further processing. Plasma source ion implantation (PSII) using a plasma generated from non-reactive gas is then used to achieve implantation of dopant atoms from the thin film 38 into the substrate 20. As described above, the plasma is preferably generated from argon gas, although other inert gases may be used for the ambient material from which the plasma is generated.

The plasma may be generated in the chamber 11 by admitting the argon gas into the chamber 11 from the gas source 28 through the line 29 as described above. Any of the methods commonly known in the art of PSII for generating a plasma from an inert gas may be used to ionize the argon gas. For example, the plasma may be generated from the argon gas using a hot filament based source of electrons. By this method, a heated filament (not shown) is used to inject a diffuse beam of electrons into the gas filled chamber 11. The beam of electrons from the source spreads through the interior 15 of the chamber 11, colliding with the neutral gas therein to form ions. The action of the magnetic fields created by the magnets 32 acts to maximize the number of collisions. One drawback of this method is that ions of material from the filament source of electrons could be introduced into the argon plasma and subsequently become implanted into the substrate target 20, thereby contaminating the substrate.

Another method of plasma formation is by radio frequency (rf) excitation. The rf technique may employ, for example, the capacitive discharge between the two plates of an rf capacitor to generate the plasma. As with the filament based plasma source, the capacitor plates used to generate the plasma are a potential source of material which might contaminate the substrate 20. The capacitor plates may be coated in B or $B_4C$ to help eliminate such contamination effects. The presence of B or $B_4C$ on the rf capacitor plates would act as a dielectric, affecting the electric field between the plates, but not rendering the ionization process ineffective. Radio frequency induction excitation may also be used. This excitation technique employs, for example, a loop antenna on which time varying currents are driven to excite a time varying magnetic field which, in turn, couples to (and sustains) the plasma. The antenna is a potential source of impurities but this potential can be mitigated by coating the antenna with B (or $B_4C$). Such a coating will have a negligible effect on the magnetic field and will thus not interfere with formation of the plasma.

Other plasma generation techniques could also be employed. For this application, however, wherein, as will be seen, a relatively low voltage is used for drawing ions from the plasma to the target surface, and wherein there is a relatively low neutral gas pressure of argon, generation of the ions simultaneously with implantation, for example by a glow discharge method, is probably not possible.

The plasma could also be generated remotely and fed into the processing chamber 11. The plasma could be generated in the remote chamber by any of the means described above or by any other means known in the art, and then streamed into the vacuum chamber 11. This would eliminate the potential contamination problems arising from generating the plasma in the same chamber 11 where the PSII process is to take place.

The resulting argon plasma preferably has an ion density of approximately $10^8$ to $10^{10}$ ions per cubic centimeter. Only a small percentage of the atoms in the plasma are ionized at any given instance. The plasma is essentially electrically neutral, since it consists of approximately equal numbers of electrons and positive ions. Typically, however, there will be a slight excess of positive ions to electrons in the plasma. This is because electrons tend to bounce into the grounded walls of the chamber 11 more often than the positive ions. The generated plasma will typically be at a voltage level with respect to ground of approximately one volt or, at most, a few volts.

When a negative potential is supplied to the stage 21 from the voltage source 24, a plasma sheath will form around the stage 21 and the substrate wafer 20, which are immersed in the plasma. The plasma sheath is a region, between a quasi-charge-neutral plasma and an electrode, in this case the stage 21, in which charge neutrality is violated. Three time scales govern the dynamic response of the sheath. Just prior to the application of a voltage pulse to the stage 21, at time t=0, the stage 21 is at zero potential. As the voltage pulse is applied to the stage 21, and the potential of the stage increases to the maximum negative potential, electrons are expelled from a region near the electrode 21 and the substrate 20. This expulsion occurs rapidly, on a time scale governed by the inverse electron plasma frequency. During this initial expulsion of electrons, the much heavier ions experience negligible motion, so that as the electrons are repulsed, they leave behind a region of nearly uniform ion space charge. This positive space charge region establishes a potential profile which can be described by an ion-matrix model. Later on during application of the voltage pulse, on a slower time scale governed by the inverse ion plasma frequency, ions are accelerated toward the electrode stage 21 and the substrate 20 as they fall through the ion-matrix sheath. At a later time during the application of the pulse, on a much longer time scale (much greater than the inverse ion plasma frequency), the decreasing ion density inside the sheath region causes a corresponding decrease in the electron density, and consequently the sheath edge expands outwardly at approximately the plasma ion acoustic velocity. At the outer edge of the plasma sheath there is still a mix of ions and electrons. This outer edge of the sheath essentially becomes the other electrode in the system, the first electrode being the stage 21.

To accelerate ions from the plasma toward the substrate surface 20 as described above, the power supply 24 preferably applies a negative voltage pulse having a magnitude of 1 kV to several kV to the conductive stage 21. The turn-on and turn-off times of the pulsed waveform produced by the power supply 24 are preferably on the order of 1 microsecond or less. The pulse on time is preferably between 1 and 10 microseconds with a pulse repetition frequency of 100 to 1,000 pulses per second. The pulse waveform is applied for approximately 10 to 60 minutes. The resulting current through the voltage source 24 will be on the order of one ampere to tens of amperes. As described above, the voltage source 24 can be implemented in various manners, including by the use of SCR technologies. Conceivably, the implantation step of the present invention could be achieved with a constant applied voltage (DC voltage) rather than a pulsed voltage waveform. This would require, however, the maintenance of a higher plasma density. More power would also be required to accomplish implantation with a DC voltage. Also, higher plasma erosion of the walls of the chamber 11 is likely to result.

Figure 3:
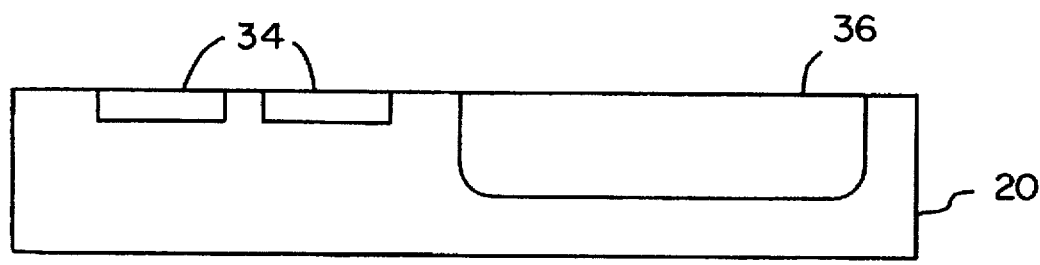
FIG. 3 is a view of the substrate of FIG. 2 after the p-type material has been driven into the substrate using plasma source ion implantation and the mask material and excess p-type material have been removed.

Application of the voltage pulses to the conducting stage 21 draws ions from the plasma toward the stage 21 and substrate 20 as described above. Since the substrate 20 is situated between the plasma and the electrode stage 21, ions drawn to the stage 21 will impact the substrate 20. The ions achieve an ion energy sufficient to impact the surface of the substrate 20, such that bombarding argon ions from the plasma will knock a certain fraction of the atoms in the thin deposition layer 38 into the Si substrate 20 to form a very shallow surface layer 34 as shown in FIG. 3. The depth of the shallow layer may be approximately 200–1000 angstroms. To generate a slightly deeper layer, such as for the p-doped well 36, the duration or the voltage of the PSII process may be extended or increased, respectively. To prevent deeper implantation of the shallow p-doped layers 34, these areas of the substrate may be masked upon reaching the desired deposition depth before implantation of the deeper region 36 continues. The PSII step results in atoms being driven into the substrate 20. For argon plasma implantation of $B_4C$, the argon ions will drive in either B atoms or C atoms, but not $B_4C$ molecules. As discussed above, the implantation of C along with B will generally not have serious deleterious effects on the resulting semiconductor device's operation characteristics.

It may be preferable to follow the implantation step with a cleaning of the substrate surface 20. A sputter cleaning with low energy argon or xenon ions will remove any remaining boron containing film from the surface of the substrate 20. A sputtering dose of $10^{16}$ to $10^{18}$ argon ions/cm$^2$ may be used. A plasma containing the ions may be generated by standard means such as those described above. A lower magnitude voltage pulse is applied from the voltage source 24 to the substrate stage 21 for the cleaning step than is applied for implantation. The magnitude of the voltage pulse for sputter cleaning is below 1 kV, and may be as low as 50–300 V. A voltage pulse waveform having a repetition rate of 100 to 1000 pulses per second and duty cycle of 0.001 to 1.0 may be used. The argon ions striking the substrate surface 20 will have a relatively low ion energy, sufficient for sputter cleaning of the surface, but not for implantation of further dopant atoms into the surface.

After cleaning, the doped substrate 20 may be subjected to a rapid annealing step. Annealing at approximately 1,000° C. for approximately 10 seconds heals the crystalline lattice of the substrate 20 which becomes damaged from the implantation of the dopant ions. Besides healing the damaged lattice, the annealing step will also cause any incidentally implanted argon ions from the implantation or cleaning steps to diffuse out of the silicon substrate 20.

Figure 4:
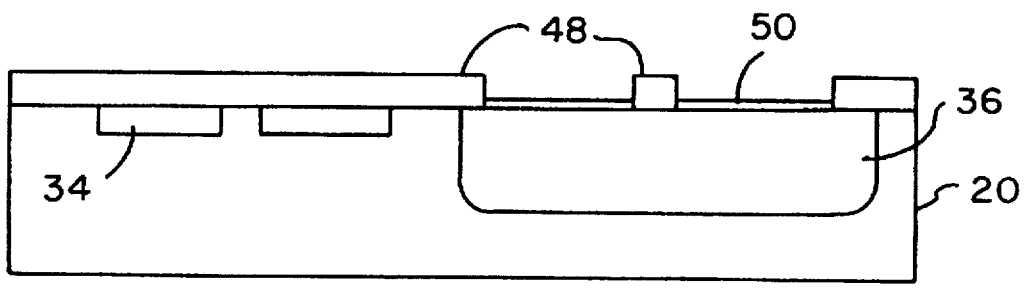
FIG. 4 is a view of the substrate of FIG. 3 with the addition of a mask material and a thin film of n-type material deposited thereon.

Having completed the implantation of the p-type regions, the n-regions may now be doped with P. As shown in FIG. 4, a masking material 48 is deposited on the substrate surface 20 as described above, in any manner commonly known in the art of semiconductor device fabrication, to establish the regions where n-type doping is to take place. A thin film of phosphorus is then deposited in the locations on the substrate 20 where n-type doping is desired. The depth of the deposited layer may be approximately 5 to 20 angstroms. The P film 50 is preferably vapor deposited from the solid red phosphorus doping material described earlier. The red phosphorous source of n-type dopants 52 may be vaporized by heating in a hearth 54. The hearth 54 may be attached to a support arm 55 and may be admitted to or removed from the chamber 11 through a door (not shown) in the chamber wall. The arm 55 and door may be formed in a conventional fashion such that the integrity of the vacuum chamber is maintained and such that the door is electrically connected to the chamber wall to be at the same potential as the wall. Heating in a hearth is effective for the vaporization of materials, such as red phosphorus, having relatively low sublimation temperatures. Red type P, for example, is easily vaporized at a temperature of approximately 300° C. Upon heating, evaporated P will stream out from the hearth 54 and be deposited in a thin film 50 on the target substrate 20. Shutters 56 on the hearth can be used to help control the deposition dose. Typically, the phosphorus hearth will be situated below the target 20 and the target 20 and stage 21 will be inverted, i.e., the target will be under the stage.

After the thin film of n-type material 50 is deposited, the hearth 54 may be retracted from the chamber 11 through the door in the chamber wall. Alternatively, the stage 21 containing the substrate 20 may be moved away from the hearth, or the substrate 20 may be moved to a separate chamber for further processing.

Figure 5:
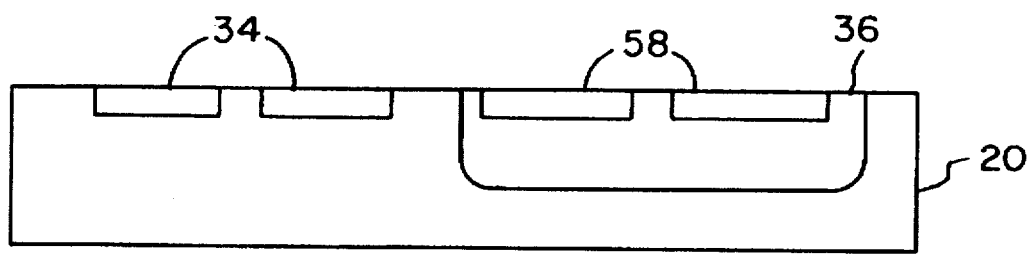
FIG. 5 is a view of the substrate of FIG. 4 after the n-type material has been driven into the substrate using plasma source ion implantation and the mask material and excess n-type material have been removed.

Doping of the n-type material then proceeds as described above for the p-type material. Implantation using a PSII process and a plasma generated from a non-reactive gas source, such as argon, is used to knock the required concentration of P atoms into the substrate 20. This results in a very shallow surface layer 58 of n-type dopant being implanted into the substrate 20 as shown in FIG. 5. The depth of the shallow layer may be approximately 200 to 1000 angstroms. After implantation, and as described above, argon sputter cleaning may be used to remove any of the remaining P film 50 from the substrate 20. An annealing step may then be used to heal the crystalline lattice. At this point the doping of the CMOS device is complete.

Figure 6:
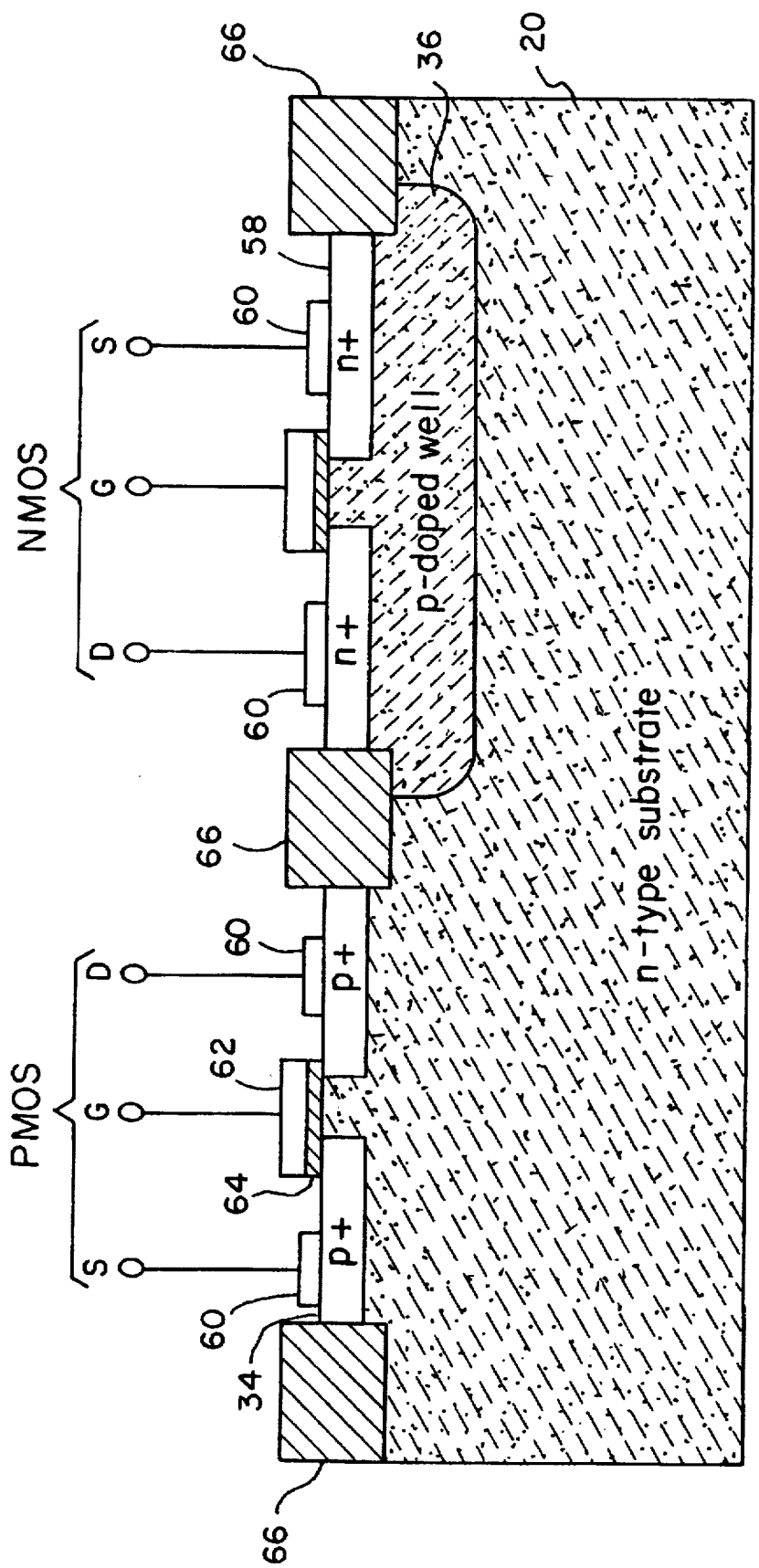
FIG. 6 is a simplified illustrative side view of FIG. 5 with additional structure to form a completed complementary metal-oxide-semiconductor (CMOS) integrated device structure.

A completed CMOS device, fabricated in accordance with the present invention, is shown in FIG. 6. The completed device 59 includes the addition of several elements to the doped substrate of FIG. 5. These additions include source S, gate G, and drain D connections to the PMOS and NMOS sides of the CMOS, including conductive connections 60 at the sources and drains, and gate oxide 62 and polysilicon 64 layers at the gates. Additionally, thick isolation layers 66, such as of silicon dioxide ($SiO_2$), are placed between the PMOS and NMOS regions. These additional elements may be established on the basic CMOS structure using materials and techniques commonly known in the area of semiconductor device fabrication.

The method and apparatus of the present invention has been described with reference to a specific application, namely, the fabrication of a shallow-junction CMOS device. As has already been noted, the present invention is also applicable to the fabrication of other semiconductor devices requiring high device concentration and shallow doped junctions. Moreover, as has already been mentioned, the steps of the method of the present invention need not all be accomplished in a single processing chamber. Deposition and implantation steps may be accomplished in separate chambers, each chamber having the required apparatus for the steps which it is to accomplish. Though the processing of a single substrate wafer was described in detail, it is apparent that the process and apparatus of the present invention are expandable to perform simultaneous processing of multiple substrate wafers. The present invention is therefore not limited to the particular embodiments or applications as set forth herein as illustrative, but embraces all such modified forms thereof as come within the scope of the following claims.

What is claimed is:

1. A method for fabricating ultra shallow junction semiconductor devices, comprising the steps of:

(a) depositing a thin film of a boron containing dopant from a solid source of the boron containing dopant onto a surface of a silicon based semiconductor substrate;

(b) surrounding the substrate surface with a plasma of ions generated from a non-reactive gas;

(c) accelerating the ions from the plasma toward the substrate surface at an ion energy sufficient to impact the film of boron containing dopant and drive boron atoms from the dopant into the substrate to dope the substrate;

(d) depositing a thin film of phosphorus from a solid source of phosphorus unto the surface of the semiconductor substrate;

(e) surrounding the substrate surface with a second plasma of ions generated from a non-reactive gas; and (f) accelerating ions from the second plasma toward the substrate surface at an ion energy sufficient to impact the film of phosphorus and drive phosphorus atoms from the film into the substrate.

2. The method of claim 1 wherein the substrate is n-type silicon.

3. The method of claim 1 wherein the boron containing dopant is selected from the group consisting of solid boron and boron carbide.

4. The method of claim 1 wherein the step of depositing the thin film of the boron containing dopant includes the step of sputtering boron from a solid boron dopant source onto the substrate.

5. The method of claim 1 wherein the step of depositing the thin film of the boron containing dopant includes the step of sputtering boron carbide from a boron carbide dopant source onto the substrate.

6. The method of claim 5 wherein the step of accelerating ions from the plasma toward the substrate also drives carbon atoms from the boron carbide film into the substrate surface.

7. The method of claim 1 wherein the step of surrounding the substrate surface with a plasma of ions includes the step of generating a plasma of ions from the non-reactive gas.

8. The method of claim 1 wherein the non-reactive gas is argon.

9. The method of claim 1 wherein the step of accelerating the ions from the plasma toward the substrate surface includes the step of applying a negative voltage pulse to a conducting stage on which the substrate is placed.

10. The method of claim 1 further comprising the additional step of cleaning the substrate surface after the boron has been driven into the substrate to remove any remaining film of boron compound from the substrate surface.

11. The method of claim 9 wherein the step of cleaning the substrate surface includes the step of sputter cleaning the substrate surface using an argon gas plasma.

12. The method of claim 1 further comprising the additional the step of annealing the substrate.

13. The method of claim 1 further comprising the additional step of masking the substrate to prevent deposition of the boron containing dopant on selected areas of the substrate surface.

14. The method of claim 1 wherein the solid source of phosphorous is red phosphorous.

15. The method of claim 14 wherein the step of depositing a thin film of phosphorous includes the step of vaporizing the red phosphorous in a hearth.

16. The method of claim 1 further comprising the additional step of cleaning the substrate surface after the phosphorous has been driven into the substrate to remove any remaining film of phosphorous from the semiconductor surface.

17. The method of claim 1 further comprising the additional step of masking the substrate to prevent deposition of the phosphorous on selected areas of the substrate surface.

* * * * *